(12) United States Patent
Furumiya et al.

(10) Patent No.: US 8,604,617 B2
(45) Date of Patent: Dec. 10, 2013

(54) SEMICONDUCTOR DEVICE

(71) Applicant: Renesas Electronics Corporation, Kanagawa (JP)

(72) Inventors: Masayuki Furumiya, Kanagawa (JP); Yasutaka Nakahsiba, Kanagawa (JP); Akira Tanabe, Kanagawa (JP)

(73) Assignee: Renesas Electronic Corporation, Kanagawa (JP)

( * ) Notice: Subject to any disclaimer, the term of this patent is extended or adjusted under 35 U.S.C. 154(b) by 0 days.

(21) Appl. No.: 13/708,207

(22) Filed: Dec. 7, 2012

(65) Prior Publication Data

US 2013/0093096 A1 Apr. 18, 2013

Related U.S. Application Data

(62) Division of application No. 12/901,021, filed on Oct. 8, 2010, now Pat. No. 8,358,009.

(30) Foreign Application Priority Data

Oct. 9, 2009 (JP) .................................. 2009-235054

(51) Int. Cl.
*H01L 23/48* (2006.01)

(52) U.S. Cl.
USPC .................. 257/758; 257/773; 257/E23.011; 257/E23.145

(58) Field of Classification Search
USPC .......... 257/750, 758, 773, 774, 776, E23.011, 257/E23.143, E23.145
See application file for complete search history.

(56) References Cited

U.S. PATENT DOCUMENTS

| | | | |
|---|---|---|---|
| 6,288,447 | B1 | 9/2001 | Amishiro et al. |
| 6,822,330 | B2 | 11/2004 | Park et al. |
| 7,005,371 | B2 | 2/2006 | Chinthakindi et al. |
| 7,576,382 | B2 | 8/2009 | Ueno |
| 7,608,909 | B2 | 10/2009 | Chinthakindi et al. |
| 7,706,202 | B2 * | 4/2010 | Obayashi et al. .......... 365/225.7 |
| 2005/0245063 | A1 | 11/2005 | Chinthakindi et al. |
| 2006/0197119 | A1 | 9/2006 | Chinthakindi et al. |
| 2010/0225005 | A1 | 9/2010 | Nishio et al. |
| 2010/0246152 | A1* | 9/2010 | Lin et al. ...................... 361/783 |

FOREIGN PATENT DOCUMENTS

| | | |
|---|---|---|
| JP | 2000-269429 | 9/2000 |
| JP | 2007-535825 | 12/2007 |
| JP | 2008-141474 | 6/2008 |
| WO | WO2005/112105 | 4/2005 |

* cited by examiner

*Primary Examiner* — Jasmine Clark
(74) *Attorney, Agent, or Firm* — Young & Thompson

(57) ABSTRACT

A semiconductor device with a transistor region has a first conductor pattern formed within a multilayer interconnect structure positioned under a signal line and above the transistor region. The first conductor pattern is coupled to ground or a power supply and overlaps the transistor region. The signal line overlaps the first conductor pattern.

12 Claims, 14 Drawing Sheets

SEMICONDUCTOR DEVICE

CROSS-REFERENCE TO RELATED APPLICATIONS

This application is a divisional of U.S. patent application Ser. No. 12/901,021, filed Oct. 8, 2010, now U.S. Pat. No. 8,358,009, the entire content and disclosure of which is incorporated herein by reference. The disclosure of Japanese Patent Application No. 2009-235054 filed on Oct. 9, 2009 including the specification, drawings and abstract is incorporated herein by reference in its entirety.

BACKGROUND OF THE INVENTION

The present invention relates to semiconductor devices having a transmission line which uses a multilayer interconnect structure.

In recent years, as the processing speeds of semiconductor devices increase, the signals which flow in semiconductor devices tend to have higher frequencies. For transmission of signals at high frequencies, a transmission line must be used.

Japanese Patent Application Publication No. 2007-535825, which corresponds to WO2005/112105, discloses a method for forming a transmission line at the back end of line in the manufacture of semiconductor devices. According to this document, a ground shield for a transmission line is formed in an interconnect layer just under a signal line.

Japanese Patent Publication No. 2008-141474 describes that a silicon substrate and a multilayer interconnect structure above it are used to form a transmission line not for a semiconductor device but as a component for interconnection. According to this document, a ground shield for the transmission line is formed by the silicon substrate.

Japanese Patent Publication No. 2000-269429 discloses that ground planes and transmission lines are formed through a CMOS process. It also discloses that a digital IC is created through a CMOS process and a matching circuit for RFIC is independently formed and these are integrated on a chip.

The present inventors have realized that these techniques have the following problem. When transistors and a transmission line are formed on a chip through a CMOS process, the transistors and transmission line are coupled by interconnect wiring. With the progress in microfabrication, there is a tendency that the resistance of the interconnect wiring is larger, resulting in an increase of loss in the transmission line. It has been thus found that even when loss in the transmission line for coupling between elements such as transistors is decreased, deterioration in characteristics occurs.

SUMMARY

According to one aspect of the invention, there is provided a semiconductor device which includes a substrate, a transistor formed in a transistor region on the substrate, a multilayer interconnect structure formed on the transistor region, a first conductor pattern formed in the multilayer interconnect structure to overlap the transistor region and coupled to a ground or power supply, a dielectric layer formed on the multilayer interconnect structure, and a signal line formed on the dielectric layer in a region in which it overlaps the first conductor pattern in a plan view, the signal line being part of a transmission line.

According to the present invention, when the signal line and the transistor formation region overlap, the distance between an element such as a transistor and the signal line is shortened and loss in the transmission line is decreased. This improves the signal transmission efficiency of the transmission line of the semiconductor device.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE PREFERRED EMBODIMENTS

Figure 1A:
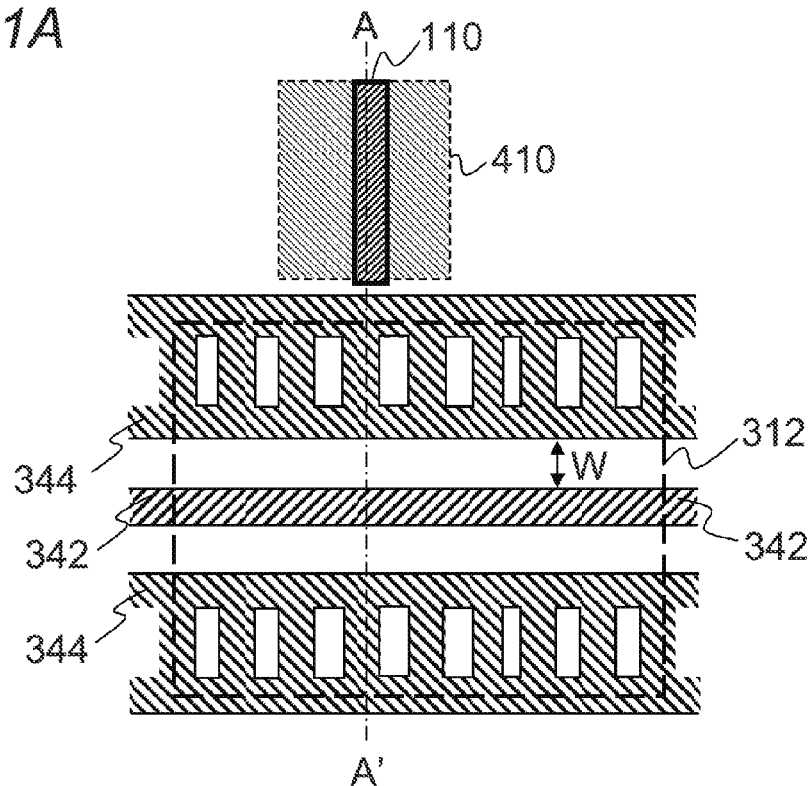
FIGS. 1A, 1B and 1C are illustrating a semiconductor device according to a first embodiment of the present invention.

The invention will now be further described herein with reference to illustrative embodiments. Those skilled in the art will recognize that many alternative embodiments can be accomplished using the teachings of the present invention and that the invention is not limited to the embodiments illustrated for explanatory purposes.

In the drawings, like components bear like reference numerals and descriptions of such components are not necessarily repeated.

Figure 1B:
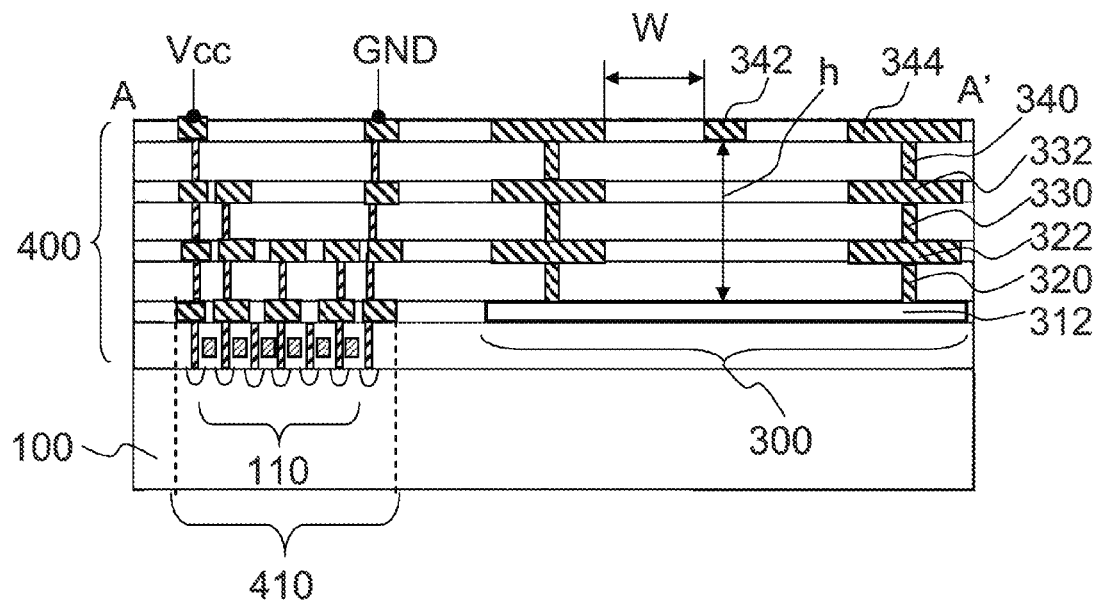
Figure 1C:
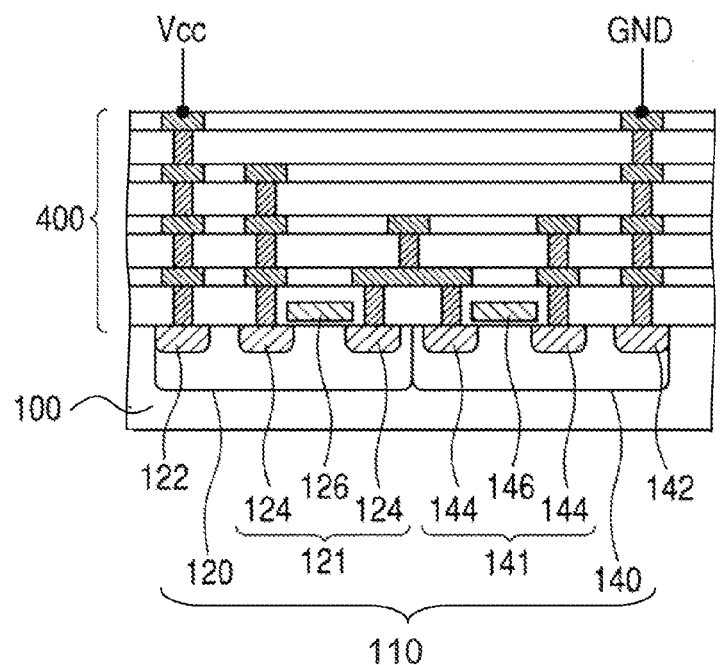

FIG. 1A is a top view and FIG. 1B is section along the line the A-A' of FIG. 1A. FIG. 1C shows the transistor region on a larger scale. This semiconductor device includes a substrate 100, first transistor 121, second transistor 141, multilayer interconnect structure 400, first conductor pattern 312, and signal line 342. The first conductor pattern 312 is formed in the n-th layer of the multilayer interconnect structure 400 ($n \geq 1$) and is coupled to a ground or power supply (for example, ground). The signal line 342 is formed in layer n+2 or higher in the multilayer interconnect structure 400 and is located in a region where it overlaps the first conductor pattern 312 in plan view. The signal line 342 and first conductor pattern 312 form at least part of a transmission line 300, although it is line 342 that carries the signal with pattern 312 being preferably electrically isolated therefrom and serving as a shield. The transmission line 300 is used to couple electronic elements in the semiconductor device.

The width of the signal line is 5 μm, for example, and the gate length of the transistor is less than 0.1 μm. The transistor region 110 as illustrated in FIG. 1B omits some of the actual number of transistors for clarity, as shown in FIG. 1C. The region 410 is the area of layer n of the multilayer interconnect structure 400 where it overlaps the underlying insulator layer in which the transistors are formed.

In the example shown in this Figure, n=1 and the first conductor pattern 312 is formed in the first interconnect layer and an interlayer dielectric film is located between the first conductor pattern 312 and substrate 100. The signal line 342 is formed in the uppermost interconnect layer (the fourth interconnect layer in this example). The first conductor pattern 312 functions as a ground shield.

At least part of the multilayer interconnect structure 400 is copper wiring which is formed by a damascene technique. However, at least part of the multilayer interconnect structure 400, for example, an upper layer thereof may be Al wiring.

In the example shown in the Figure, the transmission line 300 includes two second conductor patterns 344. The second conductor patterns 344 are formed in an interconnect layer above the n-th layer of the multilayer interconnect structure, for example in the same layer as the signal line 342 and in a plan view, they extend parallel to the signal line 342 with the signal line 342 between them. The second conductor patterns 344 are electrically coupled to the ground or power supply in the same way as the first conductor pattern 312, for example, to the ground. Like the first conductor pattern 312, conductor patterns 344 are preferably electrically isolated from the signal line 342. The height h from the signal line 342 to the first conductor pattern 312 is greater than the distance w from the signal line to each second conductor pattern 344.

The transmission line 300 includes further second conductor patterns 332 and 322. The second conductor patterns 332 are formed in the third interconnect layer and the second conductor patterns 322 are formed in the second interconnect layer. In a plan view, the second conductor patterns 332 and 322 extend parallel to the signal line 342 with the signal line 342 between them. Particularly in this embodiment, the second conductor patterns 344, 332, and 322 overlap each other in a plan view. The second conductor patterns 332 and 322 are electrically coupled to the ground or power supply in the same way as the first conductor pattern 312, for example, to the ground. In a plan view, the first conductor pattern 312 is formed like a sheet over all or almost all of the region in which the signal line 342 and second conductor patterns 344 are formed.

The second conductor patterns 344, 332, and 322 are thus formed in one or more of the interconnect layers of the multilayer interconnect structure 400 from the n+1 layer up to and including the interconnect layer in which the signal line 342 lies. The second conductor patterns 344, 332, and 322 are coupled to the first conductor pattern 312 through first vias 340, 330, and 320 in the multilayer interconnect structure 400. In this structure, the second conductor patterns 344, 332, and 322 and the first vias 340, 330, and 320 surround the signal line 342 together with the first conductor pattern 312, functioning as a ground shield. In a horizontal section, the first vias 340, 330, and 320 may look not like dots but like lines extending in the same direction as the second conductor patterns 344, 332, and 322.

In the multilayer interconnect structure 400, the thickness of the interlayer dielectric film as an insulating film located between interconnect layers is, for example, 0.1 μm or more and 10 μm or less and the thickness of the interconnect layer dielectric film as an insulating film forming an interconnect layer is, for example, 0.1 μm or more and 10 μm or less. At least part of the interconnect layer dielectric film and/or the interlayer dielectric film may be low-permittivity dielectric whose permittivity is lower than silicon oxide (for example, 2.7 or less in relative permittivity).

The substrate 100 is a silicon substrate, for example. The first transistor 121 and second transistor 141 are part of a logic circuit, making up a CMOS transistor. The first transistor 121 and second transistor 141 are included in the transistor region 110. More specifically, the first transistor 121 is of the first conductivity type and formed in a well 120 of the second conductivity type. The first transistor 121 has two first-conductivity type doped regions 124 to become a source and a drain, and a gate electrode 126. The second transistor 141 is of the second conductivity type and formed in a well 140 of the first conductivity type. The second transistor 141 has two second-conductivity type doped regions 144 to become a source and a drain, and a gate electrode 146. A gate dielectric film (not shown) underlies each of the gate electrodes 126 and 146. The two gate dielectric films are equal or nearly equal in thickness.

A second-conductivity type doped region 122 is formed in the well 120 and a first-conductivity type doped region 142 is formed in the well 140. The doped region 122 is coupled to an interconnect which gives reference voltage to the first-conductivity type first transistor 121 and the doped region 142 is coupled to an interconnect which gives reference voltage to the second-conductivity type second transistor 141.

Figure 2:
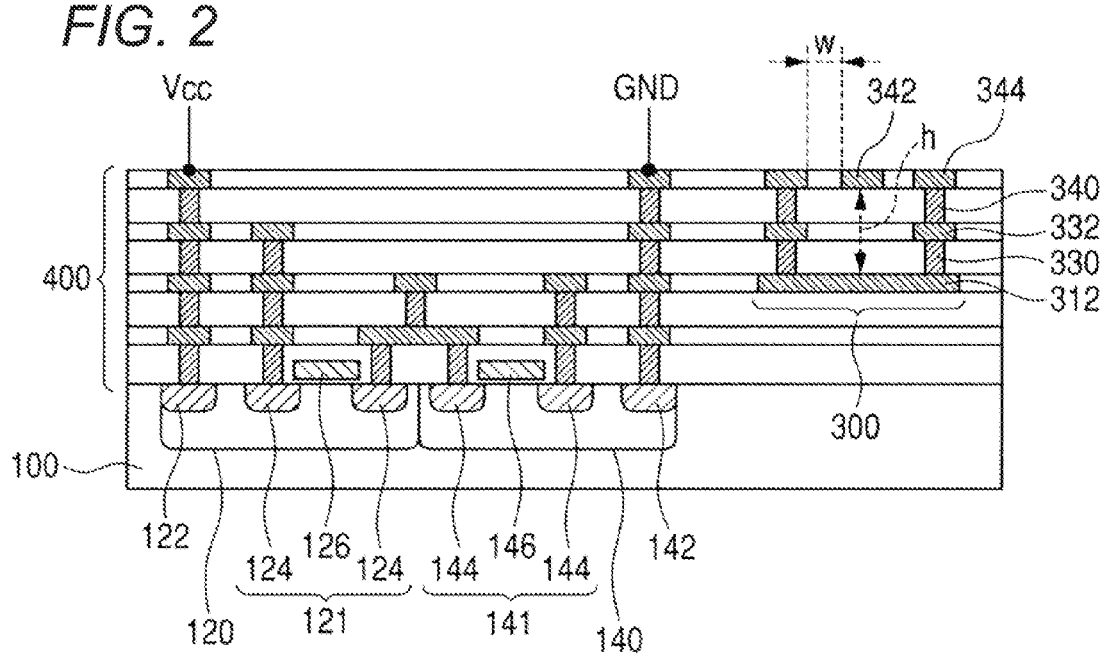
FIG. 2 shows a variation of the semiconductor device in FIG. 1.

The semiconductor device shown in FIG. 2 is structurally the same as the semiconductor device shown in FIG. 1 except that the first conductor pattern 312 is formed in the second interconnect layer from the bottom. Nevertheless, FIG. 2 depicts the semiconductor region on a substantially larger horizontal scale than the transmission line 300, for ease of understanding. In this structure as well, the height h from the first conductor pattern 312 to the signal line 342 is larger than the distance w from the signal line 342 to the second conductor pattern 344. Thus, the interconnect layer in which the first conductor pattern 312 is formed may be varied according to the design impedance value of the transmission line 300.

Next, the effects of this embodiment will be explained. According to this embodiment, the signal line 342 and first conductor pattern 312 make up a microstrip line. At least one interconnect layer (two interconnect layers in the example shown in FIG. 1) lies between the signal line 342 and first conductor pattern 312. For this reason, the height from the first conductor pattern 312 to the signal line 342 can be sufficiently large (for example, h>w) so that the capacitance generated between the signal line 342 and first conductor pattern 312 is decreased. Consequently the impedance of the transmission line 300 can be increased. Therefore, even when the semiconductor device is more miniaturized, it is possible to design the transmission line 300 so that it has a desired impedance (for example, 50 or 75 ohms).

The ground shield for the transmission line 300 is formed not by the substrate 100 but by the first conductor pattern 312. Therefore, leakage of high frequency signals from the first conductor pattern 312 as a return path is suppressed.

This improves the signal transmission efficiency of the transmission line 300.

Particularly in this embodiment, the second conductor patterns 344 are located so as to sandwich the first conductor pattern 312 in a plan view. Due to the presence of the second conductor patterns 344, the transmission line 300 also functions as a coplanar strip line, thereby further increasing the signal transmission efficiency of the transmission line 300. This effect is large particularly when the second conductor patterns 344 lie in the same layer as the signal line 342.

Furthermore, since the second conductor patterns 344 are coupled to the first conductor pattern 312 through the first vias 340, 330, and 320, the electrical connections between them are shortest. Therefore, even if the frequency of a signal is high, the first conductor pattern 312 and second conductor patterns 344 can function as a single ground shield.

In this embodiment, the second conductor patterns 344, 332, and 322 are formed in the interconnect layers of the multilayer interconnect structure 400 from the n+1 layer to the interconnect layer in which the signal line 342 is formed. Therefore, in the transmission line 300, leakage of high frequency signals is further suppressed, further increasing the signal transmission efficiency of the transmission line 300.

For efficient transmission of signals, it is desirable that a transmission line be designed to have a predetermined impedance (for example, 50 ohms). However, in the technique described in Japanese Patent Application Publication No. 2007-535825, which corresponds to WO2005/112105, the conductor pattern as the ground shield for the transmission line is formed in an interconnect layer just under a signal line. With the recent progress in miniaturization of semiconductor devices, there is a tendency that interconnection resistance is higher and the interconnection interlayer is thinner. For this reason, in the latest semiconductor devices, the distance between the signal line and ground shield is smaller and the capacitance generated between them is larger. Therefore, it is difficult to design a transmission line so that it has a predetermined impedance. Thus it is difficult to make a transmission line which provides a high signal transmission efficiency.

In the technique described in Japanese Patent Publication No. 2008-141474, since the ground shield for the transmission line is formed by the silicon substrate, there may occur leakage of high frequency signals from the ground shield as a return path. The use of the technique descried in Japanese Patent Publication No. 2008-141474 in semiconductor devices leads to deterioration in signal transmission efficiency.

According to the present invention, the first conductor pattern serves as a shield for the transmission line. To that end the first conductor is preferably of equal or greater width than the signal line where the two overlap, such that when viewed from above the signal line in the overlapping region would be coextensive with or contained within the area of the first conductor in that region. At least one interconnect layer lies between the interconnect layer including the first conductor pattern, and the interconnect layer including the signal line. Therefore, the signal line is spaced from the first conductor pattern. As a consequence, the capacitance generated between the signal line and shield is decreased. This means that it is easy to design the transmission line so that it has a predetermined impedance. In addition, since the first conductor pattern is formed in an interconnect layer, leakage of high frequency signals from the first conductor pattern as a return path is less likely to occur than when the first conductor pattern is in contact with the substrate. This improves the signal transmission efficiency of the transmission line.

Figure 3:
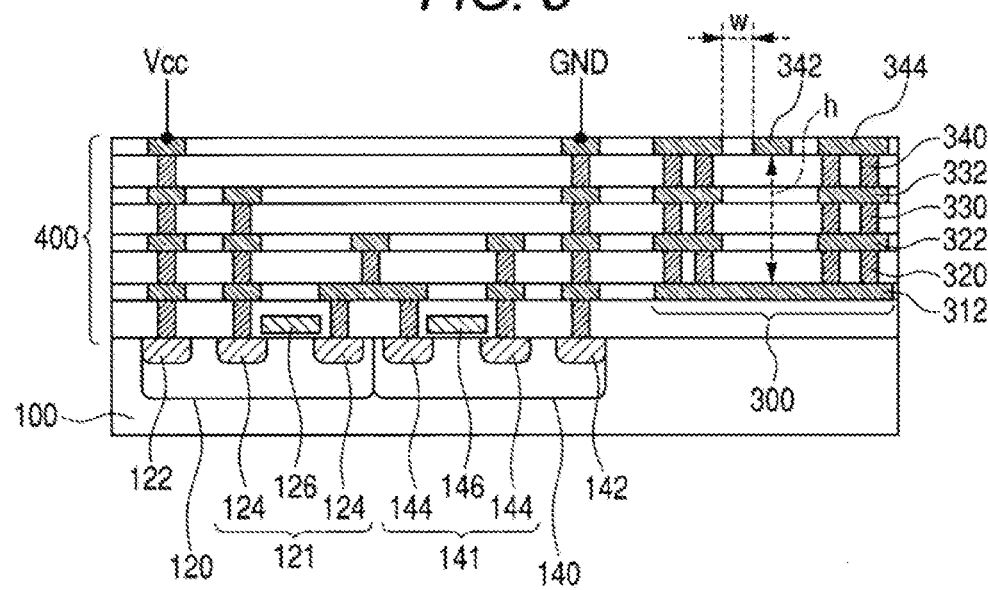
FIG. 3 is a sectional view of a semiconductor device according to a second embodiment of the invention.

FIG. 3 is a sectional view of a semiconductor device according to a second embodiment of the invention. Nevertheless, FIG. 3 depicts the semiconductor region on a substantially larger horizontal scale than the transmission line 300, for ease of understanding. This semiconductor device is structurally the same as the semiconductor device according to the first embodiment except for the following points.

First, the width of the second conductor patterns 344, 332, and 322 is larger than that of the signal line 342. In addition, the first vias 340, 330, and 320 are each provided in a plurality when viewed in the width direction of the second conductor patterns 344, 332, and 322. In the example shown in FIG. 3, as for each of the first vias 340, 330, and 320, two vias are formed when viewed in the width direction of the second conductor patterns 344, 332, and 322; it is also possible to form three or more vias.

This embodiment brings about the same effects as the first embodiment. Also, since the width of the second conductor patterns 344, 332, and 322 is larger than that of the signal line 342, the shield effect of the second conductor patterns 344, 332, and 322 is higher. Also, the first vias 340, 330, and 320 are each provided in a plurality when viewed in the width direction of the second conductor patterns 344, 332, and 322, so the resistance between the first conductor pattern 312 and the second conductor patterns 344, 332, and 322 is lower. Therefore, the signal transmission efficiency of the transmission line 300 is further increased.

In the first embodiment, the width of the second conductor patterns 344, 332, and 322 may be larger than the width of the signal line 342, as in the second embodiment.

Figure 4:
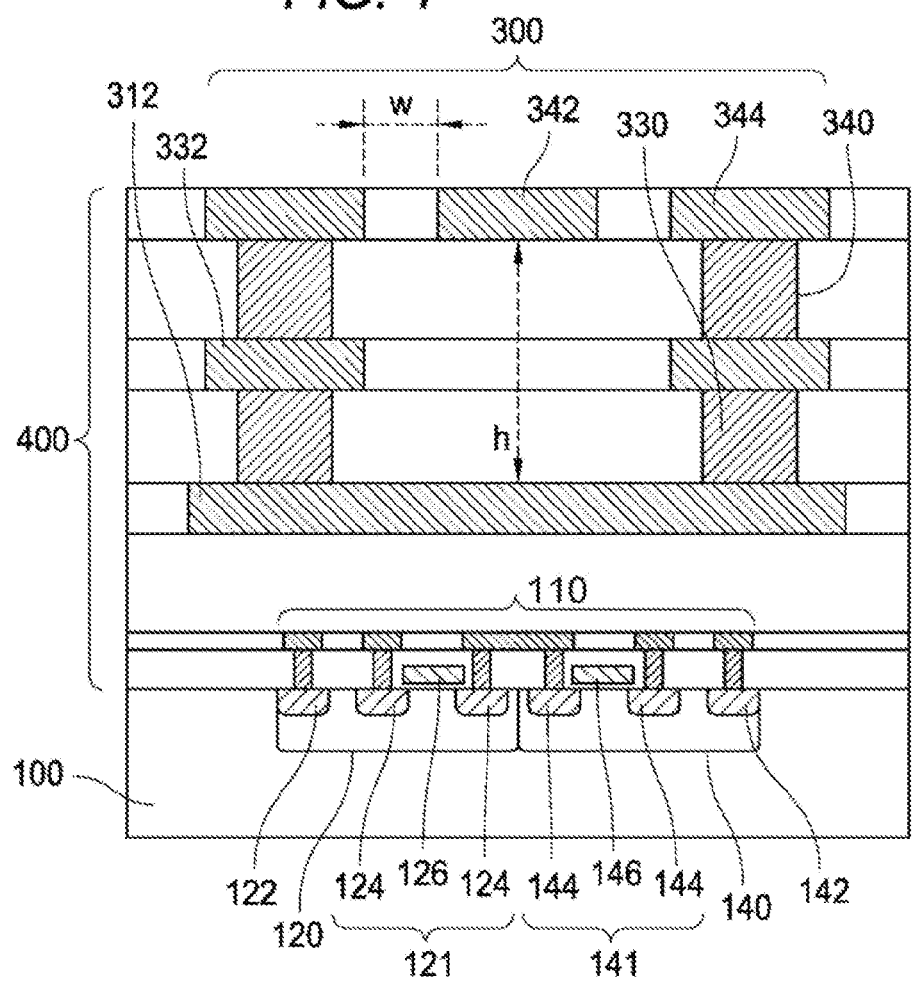
FIG. 4 is a sectional view of a semiconductor device according to a third embodiment of the invention.

FIG. 4 is a sectional view of a semiconductor device according to a third embodiment of the invention. The transistor region 110 as illustrated in FIG. 4 omits some of the actual number of transistors for clarity. This semiconductor device is structurally the same as the semiconductor device shown in FIG. 2 except that the transistor region 110 overlaps the first conductor pattern 312 of the transmission line 300 in a plan view. The top view of the semiconductor device of this embodiment is same as that of FIG. 12B.

More specifically, in this embodiment, the transistor region 110 lies under the transmission line 300. Therefore, the interconnect wiring used to couple the transistors to the transmission line can be shorter than when the transistor region 110 is formed in a different region from the transmission line 300. Therefore, loss in the transmission line can be decreased and the signal transmission efficiency of the transmission line of the semiconductor device can be improved. In addition, the semiconductor device can be smaller. In addition, since the first conductor pattern 312 lies between the signal line 342 and the transistor region 110, the influence of a signal transmitted through the signal line 342 on operation of the transistor region 110 is suppressed. This effect is outstanding particularly when the signal line 342 is surrounded by the first conductor pattern 312, second conductor patterns 332 and 344 and first vias 330 and 340 as illustrated in FIG. 4.

Figure 5:
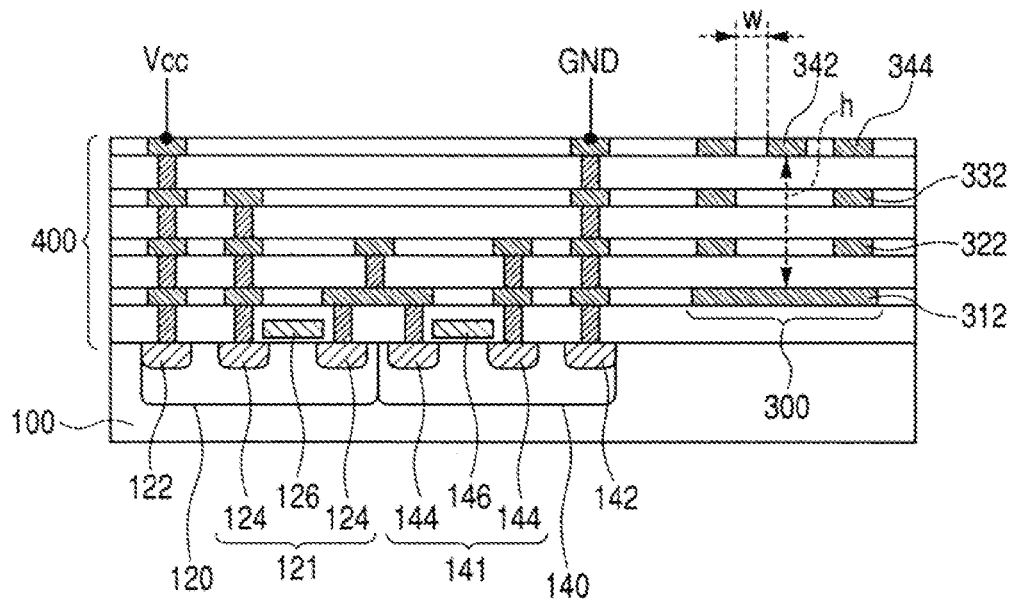
FIG. 5 is a sectional view of a semiconductor device according to a fourth embodiment of the invention.

FIG. 5 is a sectional view of a semiconductor device according to a fourth embodiment of the invention. Nevertheless, FIG. 5 depicts the semiconductor region on a substantially larger horizontal scale than the transmission line 300, for ease of understanding. This semiconductor device is structurally the same as the semiconductor device according to the first embodiment except for the following points.

First, this semiconductor device does not have first vias 340, 330, and 320. The second conductor patterns 344, 332, and 322 may be coupled to the ground or power supply in the same way as the first conductor pattern 312 or differently from it.

This embodiment brings about the same effects as the first embodiment. Also, since the second conductor patterns 344, 332, and 322 may be coupled to the ground or power supply differently from the first conductor pattern 312, more freedom is allowed in the arrangement of interconnects.

Figure 6:
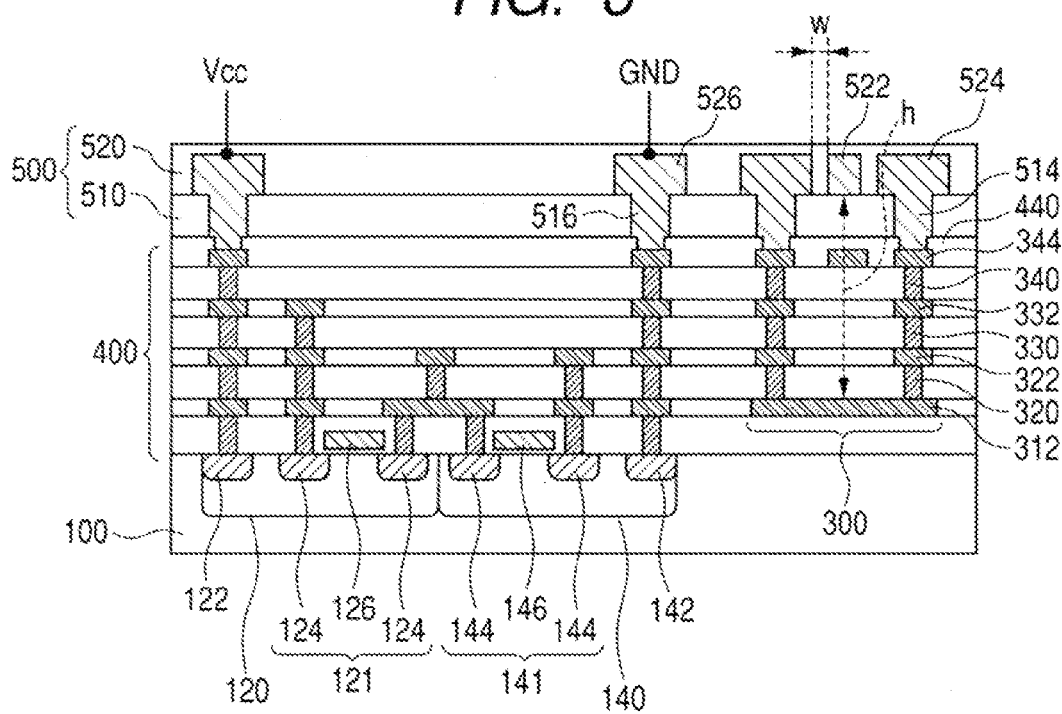
FIG. 6 is a sectional view of a semiconductor device according to a fifth embodiment of the invention.

FIG. 6 is a sectional view of a semiconductor device according to a fifth embodiment of the invention. Nevertheless, FIG. 6 depicts the semiconductor region on a substantially larger horizontal scale than the transmission line 300, for ease of understanding. This semiconductor device is structurally the same as the semiconductor device according to the first embodiment except for the following points.

First, a signal line 522 is provided in place of the signal line 342. The signal line 522 lies over the lower layer 510 of a double-layer organic resin layer 500 lying over the multilayer interconnect structure 400. The organic resin layer 500 is, for example, a polyimid resin layer in which the upper layer 520 lies over the lower layer 510. Also two second conductor patterns 524 lie over the lower layer 510. In a plan view, the second conductor patterns 524 extend parallel to the signal line 522 with the signal line 522 between them. The width of the second conductor patterns 524 is larger than that of the signal line 522.

The top dielectric layer of the multilayer interconnect structure 400 is a passivation film 440. The passivation film 440 has an opening located above at least part of each second conductor pattern 344. A first via 514 is provided in the lower layer 510 of the organic resin layer 500. The first via 514 lies over the opening of the passivation film 440 and couples the second conductor patterns 344 and 524 each other through this opening.

A redistribution line 526 is also provided in the upper layer 520. The redistribution line 526 is coupled to the interconnect in the uppermost layer of the multilayer interconnect structure 400 through a via 516.

The redistribution line 526, signal line 522, second conductor patterns 524, first vias 514 and via 516 are formed in the same process as follows. The lower layer 510 of the polyimid resin layer 500 is first formed. Then, the lower layer 510 is exposed to light and developed. As a consequence, holes which will become the first vias 514 and via 516 are made. Then, a plating seed layer (for example, Cu layer: not shown) is formed on the upper surface of the lower layer 510 and the bottom surfaces and side walls of the first vias 514 and via 516. Then, a resist layer (not shown) is formed on the plating seed layer. Then this resist layer is exposed to light and developed. This produces trenches which will turn into the signal line 522, second conductor patterns 524, and redistribution line 526. Then, a plating process is performed using the plating seed layer as seed so that a metal layer (for example, Cu layer) grows in the holes of the lower layer 510 and the trenches of the resist layer. Consequently the redistribution line 526, signal line 522, second conductor patterns 524, first vias 514 and via 516 are formed. After that, the resist layer is removed and the upper layer 520 of the organic resin layer 500 is formed.

This embodiment also brings about the same effects as the first embodiment. Furthermore, the multilayer interconnect structure 400 and organic resin layer 500 lie between the signal line 522 and the first conductor pattern 312. Therefore, height h from the signal line 522 to the first conductor pattern 312 is larger than in the first embodiment. Therefore, since the impedance of the transmission line 300 can be further increased, it is easier to design the transmission line 300 so that it has a desired impedance (for example, 50 ohms). This effect is outstanding particularly when the semiconductor device is further miniaturized. Also, since the width of the second conductor patterns 524 is larger than that of the signal line 522, the shield effect of the second conductor patterns 524 is improved.

Figure 7:
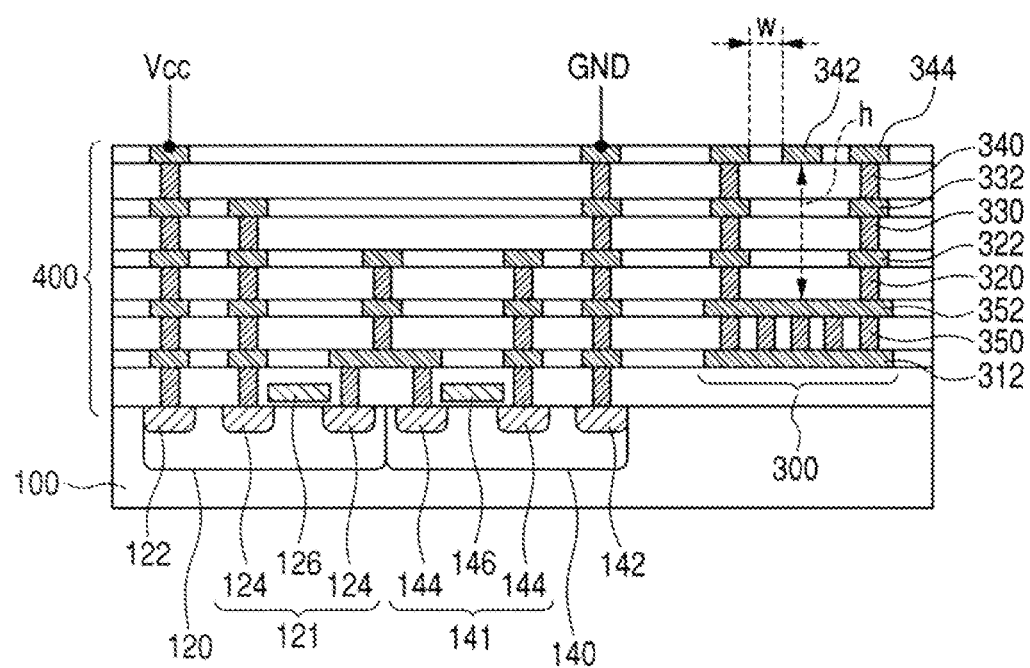
FIG. 7 is a sectional view of a semiconductor device according to a sixth embodiment of the invention.

FIG. 7 is a sectional view of a semiconductor device according to a sixth embodiment of the invention. Nevertheless, FIG. 7 depicts the semiconductor region on a substantially larger horizontal scale than the transmission line 300, for ease of understanding. This semiconductor device is structurally the same as the semiconductor device according to the first embodiment except for the following points.

First, one interconnect layer and one interlayer dielectric film are added between the interlayer dielectric film including the first vias 320, and the interlayer dielectric film including the first conductor pattern 312. The additional interconnect layer includes a secondary first conductor pattern 352 and the additional interlayer dielectric film includes second vias 350. More specifically, in this embodiment, a plurality of first conductor patterns 312 and 352 are formed, for example, in vertically adjacent layers so as to overlap each other in a plan view. The first conductor patterns 312 and 352 are coupled to each other through second vias 350. The second vias 350 are provided in a plurality. In this embodiment, height h from the signal line 342 to the first conductor pattern 352 is larger than the distance w from the signal line to the second conductor pattern 344.

Figure 8A:
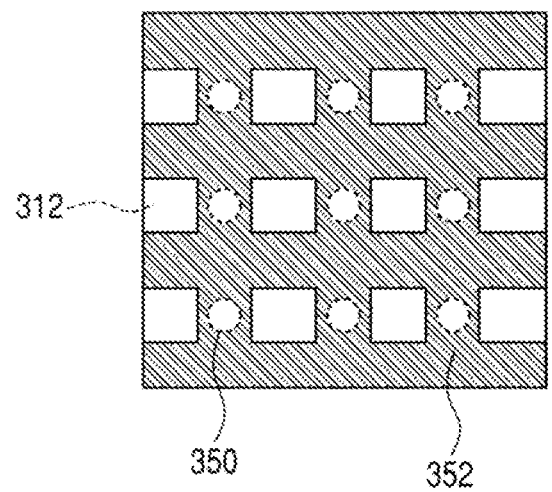
FIG. 8A is a plan view of the upper first conductor pattern and FIG. 8B is a plan view of the lower first conductor pattern.
Figure 8B:
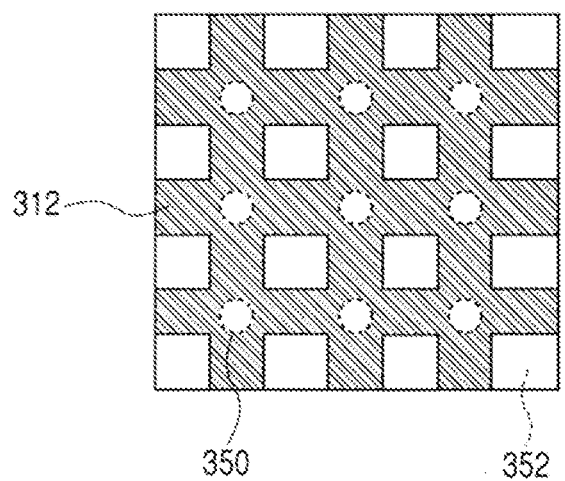

FIG. 8A is a plan view of the first conductor pattern 352 and FIG. 8B is a plan view of the first conductor pattern 312. As illustrated in these FIGures, the first conductor patterns 312 and 352 are formed in a mesh pattern and partially overlap each other in a plan view. Particularly in the example shown in the FIGures, the first conductor pattern 352 is like mesh which fills gaps in the first conductor pattern 312 in a plan view. In a plan view, the second vias 350 are located in areas where the first conductor patterns 312 and 352 overlap each other.

More specifically, the first conductor patterns 352 and 312 have virtually square holes arranged in a matrix pattern and these holes make up a mesh pattern. The holes of the first conductor pattern 352 and the holes of the first conductor pattern 312 are staggered from each other. For this reason, when the first conductor patterns 352 and 312 are put one upon the other, no gaps are visible in the first conductor patterns 352 and 312 in a plan view.

This embodiment also brings about the same effects as the first embodiment.

In this embodiment, it is also possible that the first conductor patterns 312 and 352 are like a sheet instead of mesh.

Figure 9:
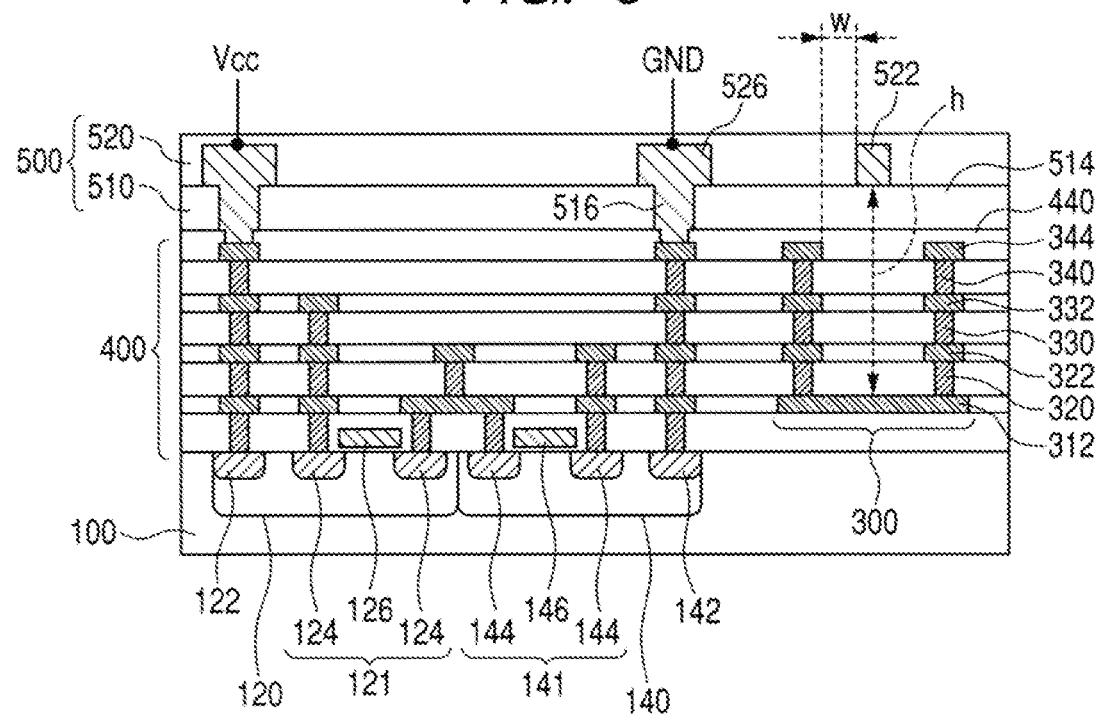
FIG. 9 is a sectional view of a semiconductor device according to a seventh embodiment of the invention.

FIG. 9 is a sectional view of a semiconductor device according to a seventh embodiment of the invention. Nevertheless, FIG. 9 depicts the semiconductor region on a substantially larger horizontal scale than the transmission line 300, for ease of understanding. This semiconductor device is structurally the same as the semiconductor device according to the fifth embodiment except that there are no second conductor patterns 524 in the same layer as the signal line 522 and there are no first vias 514 which couple the second conductor patterns 524 and 344.

This embodiment also brings about the same effects as the fifth embodiment. The absence of the second conductor patterns 524 in the same layer as the signal line 522 allows more freedom in the arrangement of interconnects in the same layer as the signal line 522.

Figure 10:
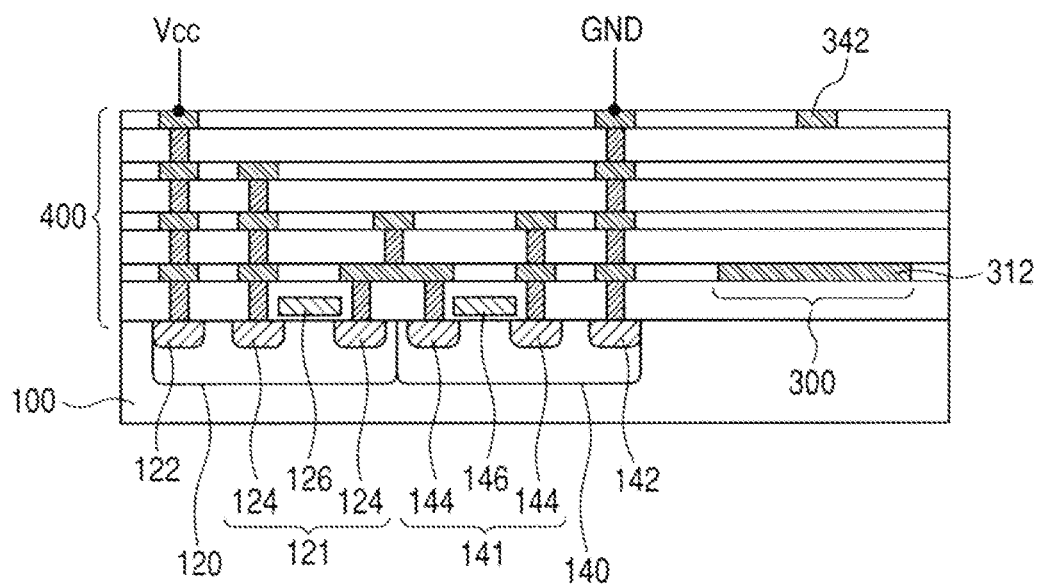
FIG. 10 is a sectional view of a semiconductor device according to an eighth embodiment of the invention.

FIG. 10 is a sectional view of a semiconductor device according to an eighth embodiment of the invention. Nevertheless, FIG. 10 depicts the semiconductor region on a substantially larger horizontal scale than the transmission line 300, for ease of understanding. This semiconductor device is structurally the same as the semiconductor device according to the first embodiment except that it has no second conductor patterns 342, 332, and 322 and first vias 340, 330, and 320. In other words, the transmission line 300 in this embodiment is a microstrip line.

In this embodiment as well, the height from the first conductor pattern 312 to the signal line 342 is sufficient so that the impedance of the transmission line 300 can be high. Therefore, even when the semiconductor device is further miniaturized, it is possible to design the transmission line 300 so that it has a desired impedance.

The ground shield for the transmission line 300 is formed not by the substrate 100 but by the first conductor pattern 312. Therefore, leakage of high frequency signals from the first conductor pattern 312 as a return path is suppressed.

Figure 11:
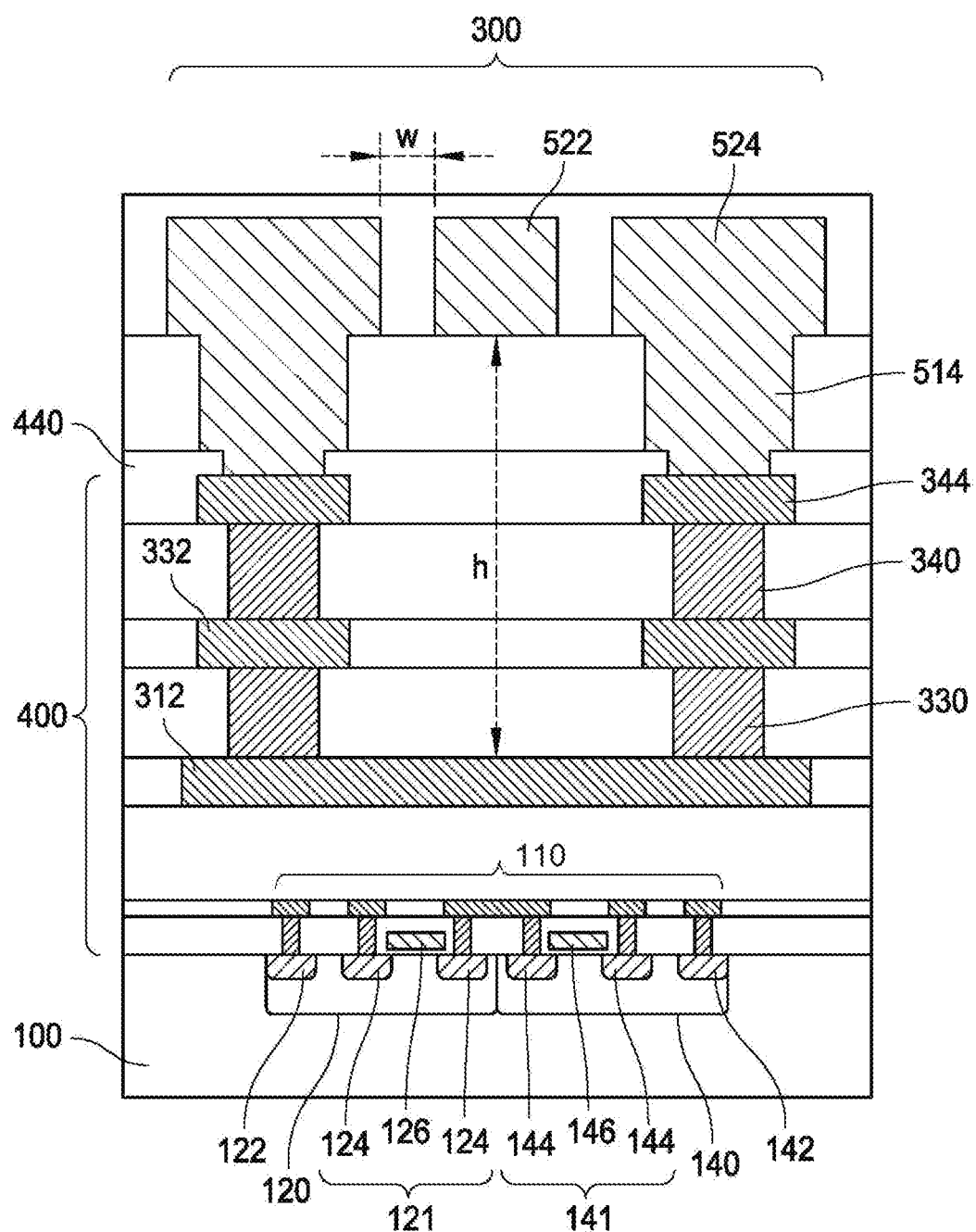
FIG. 11 is a sectional view of a semiconductor device according to a ninth embodiment of the invention.

FIG. 11 is a sectional view of a semiconductor device according to a ninth embodiment of the invention. The transistor region 110 as illustrated in FIG. 11 omits some of the actual number of transistors for clarity. This semiconductor device is structurally the same as the semiconductor device shown in FIG. 6 except that the transistor region 110 overlaps the first conductor pattern 312 of the transmission line 300 in a plan view. The top view of the semiconductor device of this embodiment is the same as that of FIG. 12B.

This embodiment also brings about the same effects as the sixth embodiment. In addition, the transistor region 110 lies under the transmission line 300. Therefore, the interconnect wiring used to couple the transistors to the transmission line can be shorter than when the transistor region 110 is formed in a different region from the transmission line 300. Therefore, loss in the transmission line can be decreased and the signal transmission efficiency of the transmission line of the semiconductor device can be improved. In addition, the semiconductor device can be smaller. Also, since the first conductor pattern 312 lies between the signal line 522 and the transistor region 110, the influence of a signal transmitted through the signal line 522 on operation of the transistor region 110 is suppressed. This effect is outstanding particularly when the signal line 522 is surrounded by the first conductor pattern 312, second conductor patterns 524, 344, and 332 and first vias 514, 340, and 330 as in the example shown in FIG. 11.

Figure 12A:
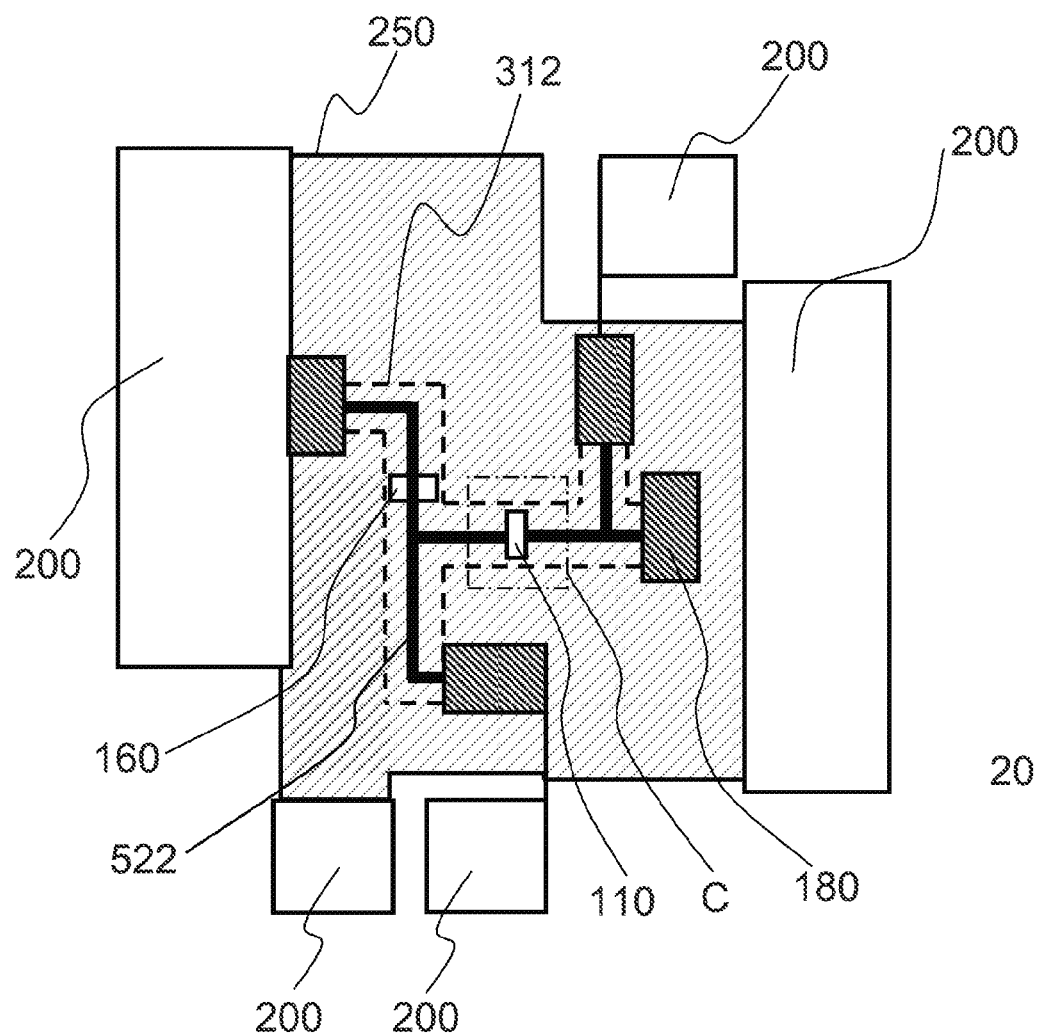
FIGS. 12A, 12B, 12C and 12D are illustrating a semiconductor device according to a tenth embodiment of the invention.
Figure 12B:
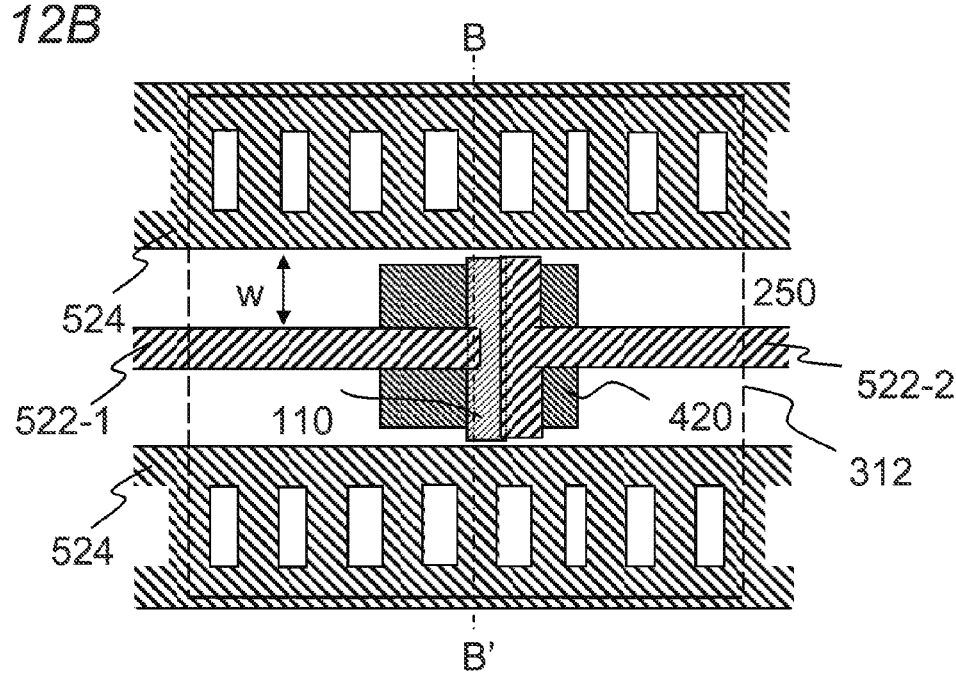
Figure 12C:
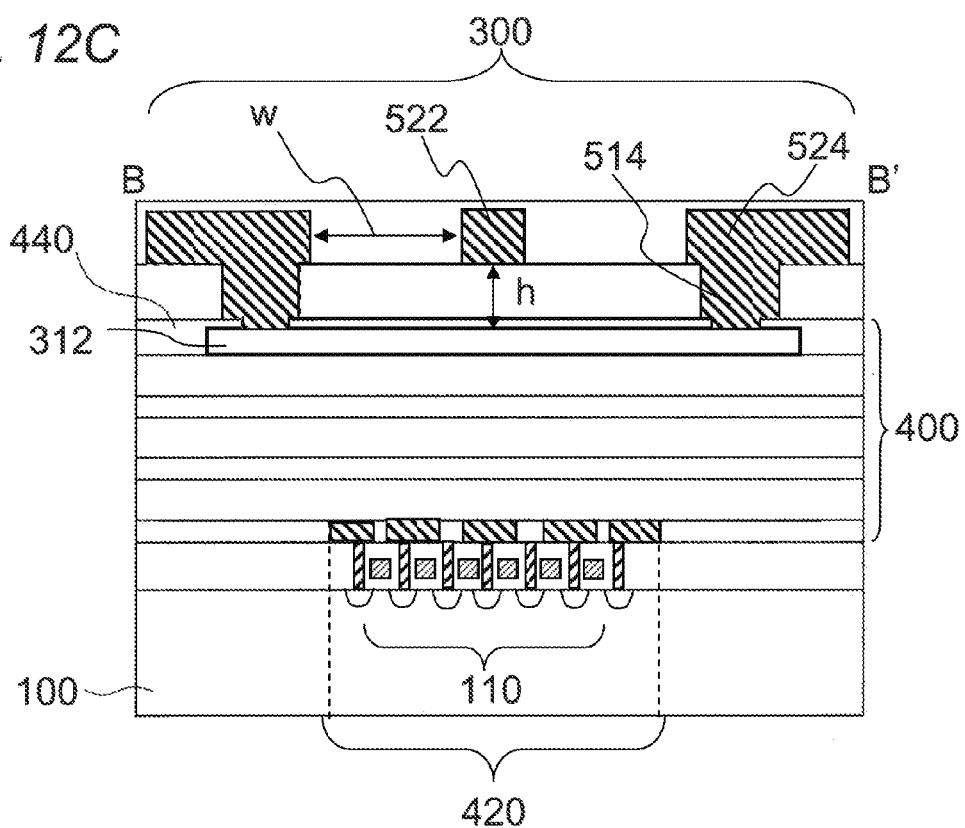
Figure 12D:
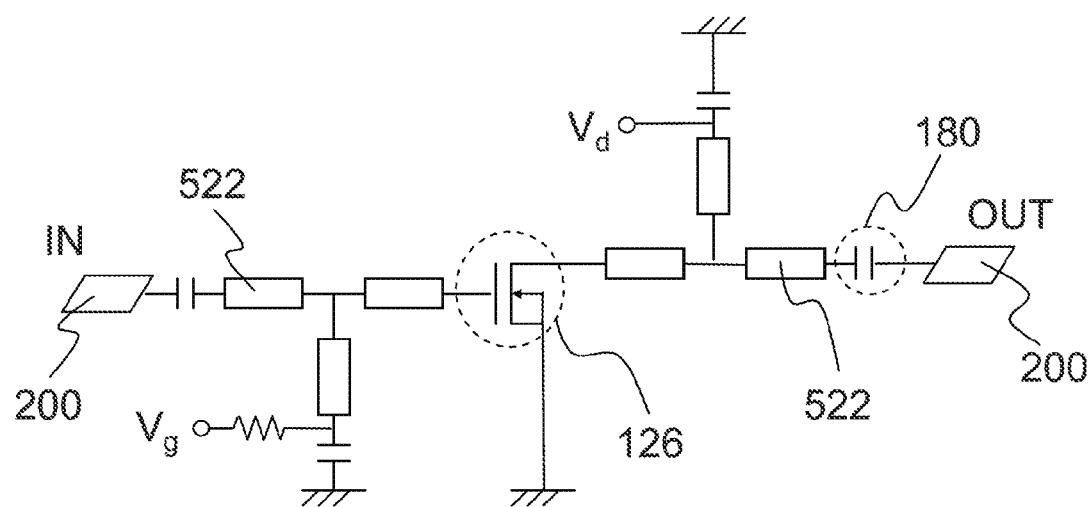

FIG. 12A shows the overall configuration of the semiconductor device of the tenth embodiment. FIG. 12B shows the region C of FIG. 12A on a larger scale. FIG. 12C is a section along the line B-B' of FIG. 12B. FIG. 12D is an equivalent circuit of the semiconductor device illustrated in FIG. 12A.

The semiconductor device 20 according to this embodiment includes first transistor region 110, second transistor region 160 and multilayer interconnect structure 400 on the first and second transistor regions. The semiconductor device 20 further includes first conductor pattern 312 formed overlying the first transistor region 110 and second transistor region 160 and a signal line 522 on a dielectric layer formed on the first conductor pattern 312.

The first conductor pattern 312 is coupled to a ground or power supply. The signal line 522 can be coupled to a transistor in transistor region 110 or a capacitor 180. The signal line 522 need not overlap the transistor region 110 but should overlap the first conductor pattern 312. The transistor region 160, which is not coupled to the signal line 522, can also be formed to overlap the first conductor pattern 312. The first transistor region 110, the second transistor region 160, the first conductor pattern 312, the capacitor 180 and the signal line 522 are formed on region 250 and those elements are connected to external terminal through a pad or a wiring.

FIG. 12B shows that a second conductor pattern 524 (not shown in FIG. 12A) can be provided to reduce the effect on signal transmission in the signal line by the transistor region 110. When the second pattern is used on the semiconductor device, the second conductor pattern is provided on the area to be covered with the first conductor pattern. The width of the signal line 522 is between 2-10 μm and the width of the second conductor pattern 524 is between 2-10 μm, for example. When the shortest length between signal line 522 and the second conductor pattern 524 is w and the height between the first conductor 312 and the signal line 522 is h, w is between 5-10 μm and h is between 4-6 μm, for example. The width of the second conductor pattern 524 is not always constant.

Signal line 522-1 is coupled to the gate electrode in the transistor region 110 and signal line 522-2 is coupled to the drain electrode in the transistor region 110. FIG. 12B illustrates an example in which the transistor region 110 and signal lines 522-1 or 522-2 overlap, but they need not overlap.

The region 420 shown in FIG. 12C is an area where an interconnect layer of the multilayer interconnect structure 400 overlaps the insulator layer including transistors. The transistor region 110 is overlapped by the first conductor pattern. The transistor region 110 and region 420 can be formed between the second conductor patterns 524. The width of the signal line is 5 μm, for example, and the gate length of the transistor is less than 0.1 μm. Therefore, the transistor region 110 will in practice include more transistors than are illustrated in the FIG. 12B.

The structure of interconnect layers of this semiconductor device is almost the same as the semiconductor device according to the ninth embodiment except for the following points.

First, the first conductor pattern 312 is formed in the uppermost interconnect layer of the multilayer interconnect structure 400 and coupled directly to the first vias 514. There are no second conductor patterns 344, 332, and 322 and first vias 340 and 330. In this structure, the transmission line 300 includes a signal line 522, first conductor pattern 312, second conductor patterns 524 and first vias 514.

In this embodiment as well, since an organic resin layer 500 lies between the first conductor pattern 312 and signal line 522, the first conductor pattern 312 is spaced from the signal line 522. Therefore, this embodiment brings about the same effects as the ninth embodiment.

Figure 17:
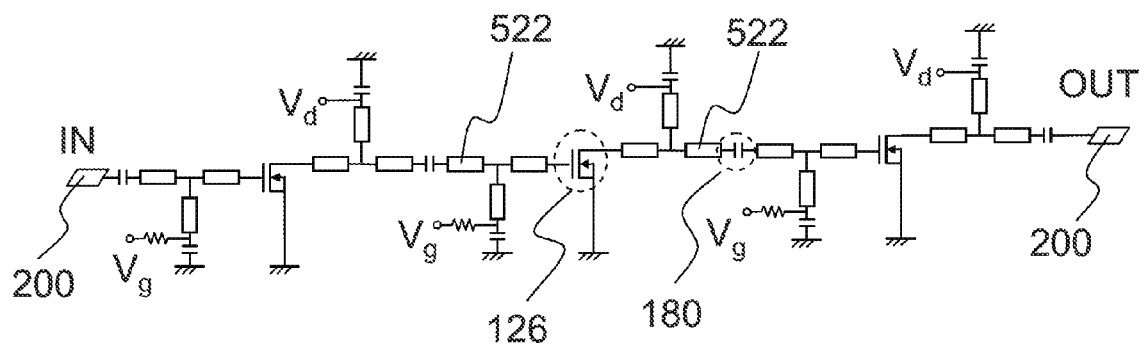
FIG. 17 illustrates an application of the tenth embodiment.
Figure 18:
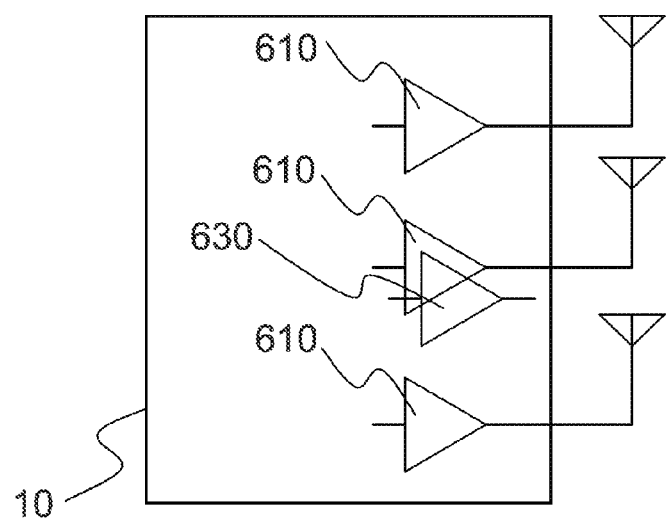
FIG. 18 illustrates an application of the tenth embodiment.

FIGS. 17 and 18 illustrate applications of this embodiment.

FIG. 17 illustrates a three channel amplifier which comprises three of the devices shown in FIG. 12D. FIG. 18 illustrates a chip 10 including plural RF amplifiers 610 shown in FIGS. 12D and 17. The RF amplifier 610 comprises transistors coupled to the signal line 522 in transistor region 110. The chip 10 further includes a base band amplifier (BB AMP) which is not an amplifier for high frequency use. The BB amplifier 630 comprises transistors which are not coupled to the signal line 522 and formed in the transistor region 630. In this application, since the BB amplifier 630 is formed under the signal line 522, the size of the chip 10 can be reduced.

Figure 13:
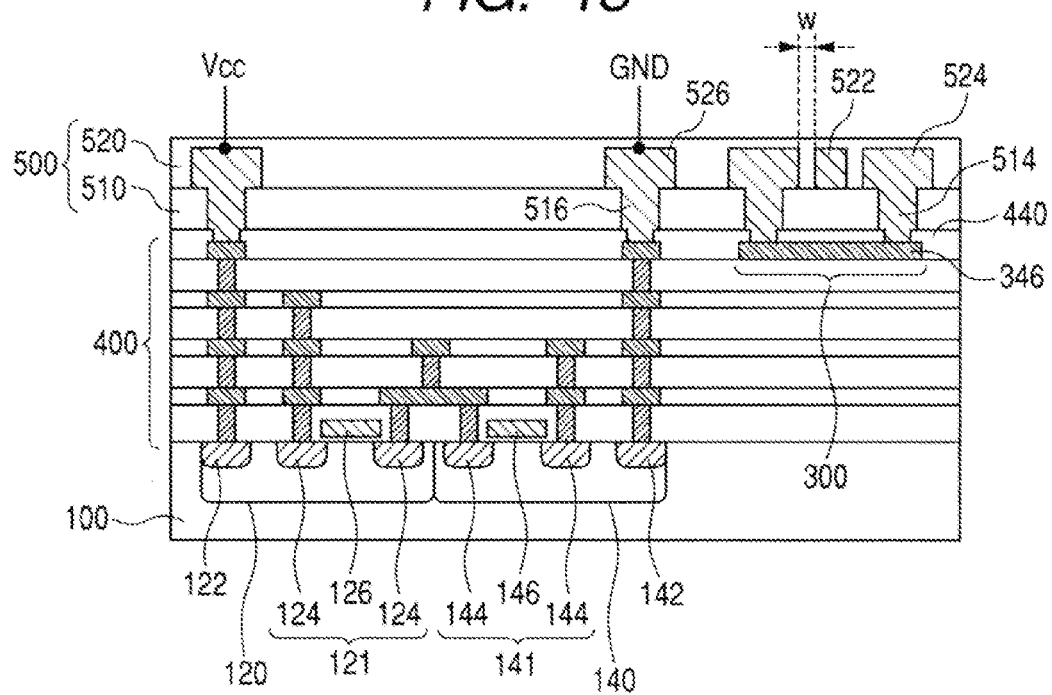
FIG. 13 is a sectional view of a semiconductor device according to an eleventh embodiment of the invention.

FIG. 13 is a sectional view of a semiconductor device according to an eleventh embodiment of the invention. Nevertheless, FIG. 13 depicts the semiconductor region on a substantially larger horizontal scale than the transmission line 300, for ease of understanding. This semiconductor device is structurally the same as the semiconductor device according to the sixth embodiment except for the following points.

First, the first conductor pattern 346 is formed in the uppermost interconnect layer of the multilayer interconnect structure 400 and coupled directly to the first vias 514. There are no second conductor patterns 344, 332, and 322 and first vias 340 and 330. In this structure, the transmission line 300 includes a signal line 522, first conductor pattern 346, second conductor patterns 524 and first vias 514.

In this embodiment as well, since an organic resin layer 500 lies between the first conductor pattern 346 and signal line 522, the first conductor pattern 346 is spaced from the signal line 522. Therefore, this embodiment brings about the same effects as the sixth embodiment.

Figure 14:
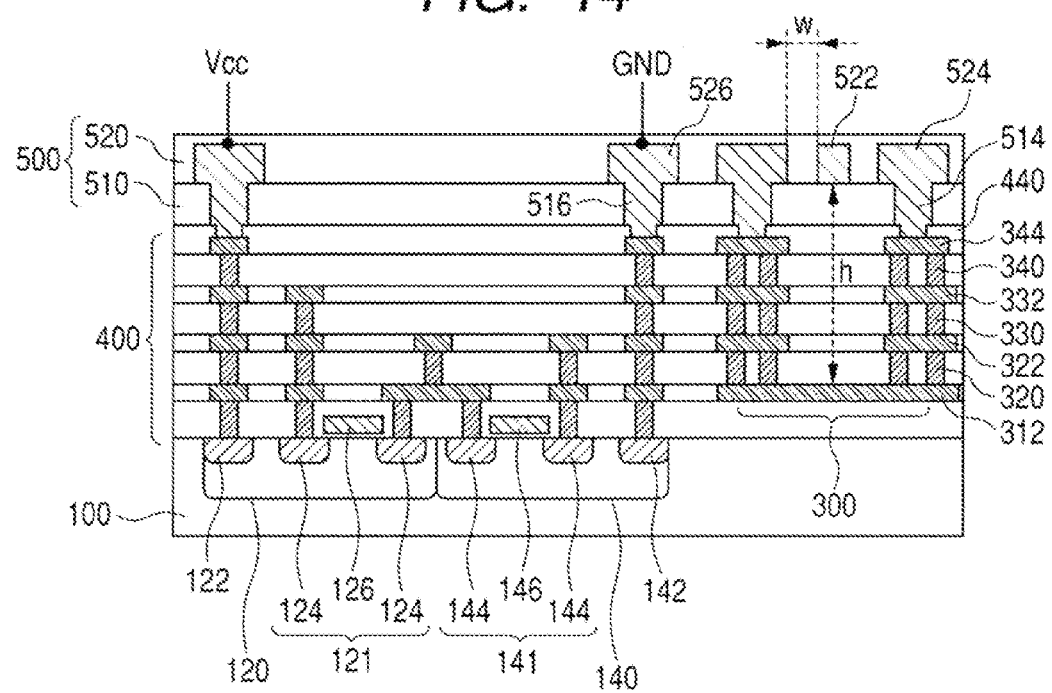
FIG. 14 is a sectional view of a semiconductor device according to a twelfth embodiment of the invention.

FIG. 14 is a sectional view of a semiconductor device according to a twelfth embodiment of the invention. Nevertheless, FIG. 14 depicts the semiconductor region on a substantially larger horizontal scale than the transmission line 300, for ease of understanding. This semiconductor device is structurally the same as the semiconductor device according to the sixth embodiment except for the following points.

First, the width of the second conductor patterns 344, 332, and 322 is larger than that of the signal line 522. In addition, the first vias 340, 330, and 320 are each provided in a plurality when viewed in the width direction of the second conductor patterns 344, 332, and 322. In the example shown in FIG. 14, as for each of the first vias 340, 330, and 320, two vias are formed when viewed in the width direction of the second conductor patterns 344, 332, and 322; it is also possible to form three or more vias. In other words, the second conductor patterns 344, 332, and 322 and first vias 340, 330 and 320 are arranged in the same way as in the semiconductor device according to the second embodiment shown in FIG. 3.

This embodiment also brings about the same effects as the sixth embodiment. Also, since the second conductor patterns 344, 332, and 322 and first vias 340, 330 and 320 are arranged in the same way as in the semiconductor device according to the second embodiment, it also offers the same effects as the second embodiment.

Figure 15:
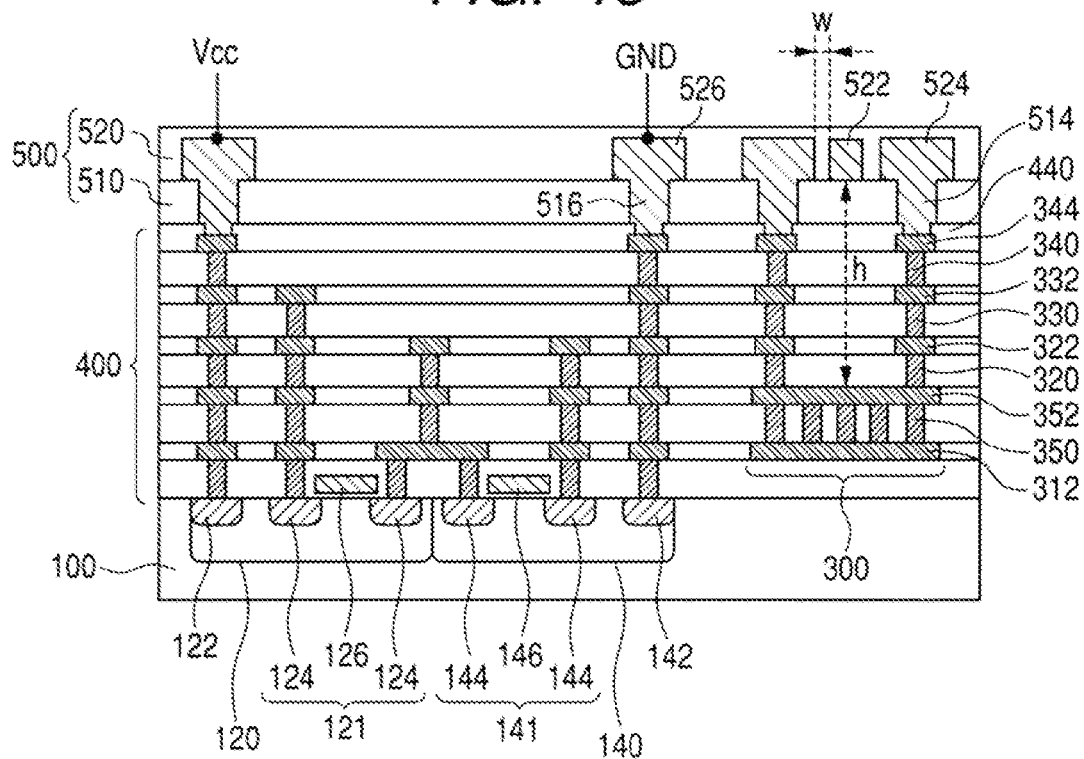
FIG. 15 is a sectional view of a semiconductor device according to a thirteenth embodiment of the invention.

FIG. 15 is a sectional view of a semiconductor device according to a thirteenth embodiment of the invention. Nevertheless, FIG. 15 depicts the semiconductor region on a substantially larger horizontal scale than the transmission line 300, for ease of understanding. This semiconductor device is structurally the same as the semiconductor device according to the sixth embodiment except for the following points.

First, one interconnect layer and one interlayer dielectric film are added between the interlayer dielectric film including the first vias 320, and the interlayer dielectric film including the first conductor pattern 312. The additional interconnect layer includes a secondary first conductor pattern 352 and the additional interlayer dielectric film includes second vias 350. The first conductor patterns 352 and 312 and second vias 350 are arranged in the same way as in the semiconductor device according to the sixth embodiment shown in FIG. 7.

This embodiment also brings about the same effects as the sixth embodiment. Also, since the first conductor patterns 352 and 312 and second vias 350 are arranged in the same way as in the semiconductor device according to the sixth embodiment, it also offers the same effects as the sixth embodiment.

Figure 16:
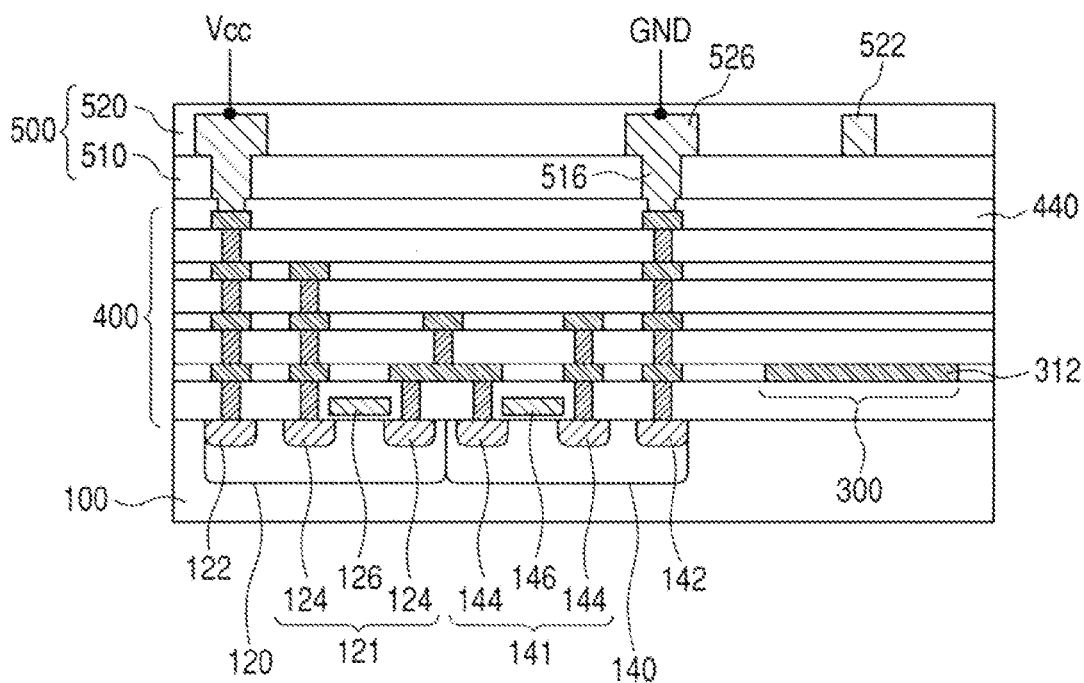
FIG. 16 is a sectional view of a semiconductor device according to a fourteenth embodiment of the invention.

FIG. 16 is a sectional view of a semiconductor device according to a fourteenth embodiment of the invention. Nevertheless, FIG. 16 depicts the semiconductor region on a substantially larger horizontal scale than the transmission line 300, for ease of understanding. This semiconductor device is structurally the same as the semiconductor device according to the sixth embodiment except that it has no second conductor patterns 344, 332, and 322 and first vias 340, 330, and 320. In other words, the transmission line 300 in this embodiment is a microstrip line as in the semiconductor device according to the eighth embodiment.

This embodiment brings about the same effects as the eighth embodiment.

The preferred embodiments of the invention have been so far explained referring to the drawings; however, they are just illustrative and the invention may be embodied in other various ways.

The above embodiments disclose the following aspects of the invention.

(Aspect 1)

A semiconductor device which includes:
a substrate;
a transistor formed on the substrate;
a multilayer interconnect structure having three or more layers which is formed over the substrate and the transistor;
a first conductor pattern formed in the n-th layer of the multilayer interconnect structure ($n \geq 1$) and coupled to a ground or power supply; and
a signal line formed in the (n+2)th layer of the multilayer interconnect structure or an interconnect layer above it and located in a region in which it overlaps the first conductor pattern in a plan view,
in which at least part of a transmission line is formed by the signal line and the first conductor pattern.

(Aspect 2)

The semiconductor device according to the first aspect, in which the transistor overlaps the first conductor pattern in a plan view.

(Aspect 3)

The semiconductor device according to the first aspect, further including an organic resin layer formed over the multilayer interconnect structure, in which the signal line is formed over the organic resin layer.

(Aspect 4)

The semiconductor device according to the first aspect, further including two second conductor patterns which are formed in an interconnect layer above the n-th layer of the multilayer interconnect structure and in a plan view, extend parallel to the signal line with the signal line between them,
in which the second conductor patterns are electrically coupled to the ground or the power supply.

(Aspect 5)

The semiconductor device according to the fourth aspect, in which the second conductor patterns are formed in the same layer as the signal line.

(Aspect 6)

The semiconductor device according to the fifth aspect, in which the height form the first conductor pattern to the signal line is larger than the distance from the signal line to the second conductor patterns.

(Aspect 7)

The semiconductor device according to the fifth aspect, in which the second conductor patterns are formed in each interconnect layer from the (n+1)th layer to the interconnect layer in which the signal line is formed.

What is claimed is:

1. A semiconductor device comprising:
a transistor formed in a transistor region on a substrate;
a multilayer interconnect structure formed over the transistor region;
a first conductor pattern formed in the multilayer interconnect structure to overlap the transistor region, said first conductor pattern being coupled to ground or to a power supply;
a first dielectric layer formed over the multilayer interconnect structure;
a signal line formed over the first dielectric layer in a region in which it overlaps the first conductor pattern in plan view, the signal line being part of a transmission line; and two second conductor patterns formed in a same conductor layer as the signal line and, in a plan view, extending parallel to the signal line with the signal line between them, wherein the second conductor patterns are electrically coupled to the first conductor pattern, wherein a distance from the signal line to the second conductor patterns is greater than a height from the first conductor pattern to the signal line.

2. The semiconductor device according to claim 1, wherein the first dielectric layer is comprised of an organic layer.

3. The semiconductor device according to claim 2, further comprising:

a second dielectric layer formed on the signal line and the two second conductor patterns such that the second dielectric layer is arranged between the signal line and the second conductor patterns, wherein the second dielectric layer is comprised of an organic layer.

4. The semiconductor device according to claim 1, wherein the first conductor pattern is formed in the uppermost interconnect layer in the multilayer interconnect structure.

5. The semiconductor device according to claim 1, wherein the two second conductor patterns are formed over the first dielectric layer in a region in which it overlaps the first conductor pattern in plan view.

6. The semiconductor device according to claim 1, wherein a width of the second conductor patterns is larger than a width of the signal line.

7. The semiconductor device according to claim 1, wherein the signal line overlaps the transistor region.

8. The semiconductor device according to claim 7, further comprising another transistor region overlapping the first conductor pattern.

9. The semiconductor device according to claim 1, wherein the transistor is electrically connected to the signal line.

10. The semiconductor device according to claim 9, wherein the transistor is included in a RF amplifier.

11. The semiconductor device according to claim 10, further comprising an another transistor in an another transistor region overlapping the first conductor pattern, wherein the another transistor is not coupled to the first conductor pattern.

12. The semiconductor device according to claim 10, further comprising an another transistor in an another transistor region overlapping the first conductor pattern, wherein the another transistor is included in an another amplifier using a different frequency from the RF amplifier.

* * * * *